United States Patent [19]

Hase et al.

[11] Patent Number: 5,350,738
[45] Date of Patent: Sep. 27, 1994

[54] METHOD OF MANUFACTURING AN OXIDE SUPERCONDUCTOR FILM

[75] Inventors: Takashi Hase, Ichikawa; Ryusuke Kita, Urayasu; Masato Sasaki, Mitaka; Tadataka Morishita, Ninomiyamachi-yamanishi, all of Japan

[73] Assignees: International Superconductivity Technology Center, Tokyo; Kabushiki Kaisha Kobe Seiko Sho, Kobe; Sharp Kabushiki Kaisha, Osaka, all of Japan

[21] Appl. No.: 949,879
[22] PCT Filed: Mar. 27, 1992
[86] PCT No.: PCT/JP92/00376
§ 371 Date: Nov. 27, 1992
§ 102(e) Date: Nov. 27, 1992
[87] PCT Pub. No.: WO92/17406
PCT Pub. Date: Oct. 15, 1992

[30] Foreign Application Priority Data

Mar. 27, 1991 [JP] Japan .................. 3-089547

[51] Int. Cl.$^5$ .............. C23C 14/24; B32B 9/00; H01L 39/00
[52] U.S. Cl. .................. 505/473; 505/701; 505/730; 505/732; 505/736; 505/742; 505/729; 427/62; 427/126.3; 428/702; 428/930
[58] Field of Search .............. 505/1, 701, 702, 730, 505/729, 732, 742, 736; 427/62, 63, 126.3, 124; 156/610; 428/930, 702

[56] References Cited

FOREIGN PATENT DOCUMENTS

028689A1 10/1988 European Pat. Off. .
1-103920 4/1989 Japan .
1-152772 6/1989 Japan .

OTHER PUBLICATIONS

Bunshah, "Desposition Technologies for films and Coatings", Noyes Publications (1982), "4 Evaporation", pp. 83–85.

Primary Examiner—Roy V. King
Attorney, Agent, or Firm—Oblon, Spivak, McClelland, Maier & Neustadt

[57] ABSTRACT

The present invention provides a method of manufacturing a high quality oxide superconductor film capable of controlling the film-forming rate and the film composition easily and forming the superconductor film safely and economically, over a wide region and homogeneously, wherein each of elements of R in which R represents one or more of elements selected from the group consisting of Y and lanthanide series rare earth elements, Ba and Cu is vapor deposited in the state of metal on a substrate under a high vacuum of lower than $10^{-8}$ Torr by a vacuum vapor deposition process to form a precursor comprising an amorphous metal and the precursor is oxidized and crystallized by applying a heat treatment without taking out the same into the atmospheric air.

18 Claims, 3 Drawing Sheets

METHOD OF MANUFACTURING AN OXIDE SUPERCONDUCTOR FILM

TECHNICAL FIELD

The present invention concerns a novel method for manufacturing an oxide superconductor film and, more in particular, it relates to a method of manufacturing an oxide superconductor film by forming a metallic film that can be a precursor for an oxide superconductor on a substrate and, subsequently, oxidizing the same and crystallizing the superconducting material by a heat treatment.

BACKGROUND ART

As a typical oxide superconductor having a superconducting transition temperature Tc higher than the boiling point of liquid nitrogen, a perovskite $RBa_2Cu_3O_7$ of three-layered structure, in which R is one or more of elements selected from the group consisting of Y and lanthanide series rare earth element has been known. Further, a $RBa_2Cu_4O_8$ type oxide in which a Cu-O single bond in the $RBa_2Cu_3O_7$ type oxide is changed into a double bond structure has also been known as a superconductor having Tc higher than of the boiling point of liquid nitrogen.

By the way, for the method of manufacturing the oxide superconductor described above into a thin film, the following two methods are generally adopted.

(1) A method of vapor depositing a starting metallic material by applying a deposition process such as laser deposition, active reaction deposition, sputtering or like other method, while locally blowing a gas such as oxygen in a film-forming chamber undergoing vapor deposition, forming an amorphous oxide of an appropriate composition into a thin film or crystallizing the oxide superconductor.

(2) A method of evacuating the inside of the film-forming chamber to a vacuum degree of about $1 \times 10^{-7}$ Torr, then evaporating metals such as Y and Cu, and $BaF_2$ on a substrate from an electron impinging type vapor deposition source and then oxidizing and crystallizing the superconducting material by applying a subsequent heat treatment in an oxygen atmosphere (disclosed, for example, by R. Feenstra, et al., in J. Appl. Phys. (Submitted)).

However, each of the prior arts as described above have the following respective drawbacks.

At first, in the method (1), it is difficult to form a thin superconductor film at high quality over a region of a large area of greater than 100 cm$^2$ in view of the constitution of the film-forming device, the difficulty in uniform supply of activating oxygen or the like. In addition, since the gas such as oxygen is introduced at the same time with film formation, the surface of the starting metallic material is oxidized, making evaporation instable and making it difficult for the accurate control of the film-forming rate and the film composition. On the other hand, in the method (2) above, film formation to a region of a large area can be conducted relatively easily since there is less restriction in view of the constitution of the device. However, this method inevitably suffers from intrusion of impurities upon vapor deposition due to residual gases such as $H_2O$, $N_2$, $H_2$ and $CO_2$. Further, since $BaF_2$ is used as an evaporation source, it is necessary to remove a F-content in the film upon oxidation and crystallization by reaction with steams at a high temperature in addition to reaction with oxygen. As a result, this not only makes the operation complicate but also generates a toxic HF gas of highly corrosive nature during reaction to bring about a problem in view of safety and sanitation. Further, since the evaporation state of $BaF_2$ is instable, it is difficult for the accurate control of the film composition.

The present invention has been achieved in order to overcome the technical problems involved in the prior art and it is an object thereof to provide a method of manufacturing an oxide superconductor film capable of easily controlling a film-forming rate and a film composition, producing the film safely and economically over a wide region, homogeneously and at a high quality.

DISCLOSURE OF THE INVENTION

The present invention provides a method of manufacturing an oxide superconductor film, which comprises vapor depositing each of elements of R in which R represents one or more of elements selected from the group consisting of Y and lanthanide series rare earth elements), Ba and Cu in the state of metal on a substrate by means of a vacuum deposition process under high vacuum, thereby forming a metallic film, and oxidizing and crystallizing the superconducting material by a heat treatment without taking the same into an atmospheric air thereby manufacturing an oxide superconductor film.

BRIEF DESCRIPTION OF THE ACCOMPANYING DRAWINGS

Figure 1:
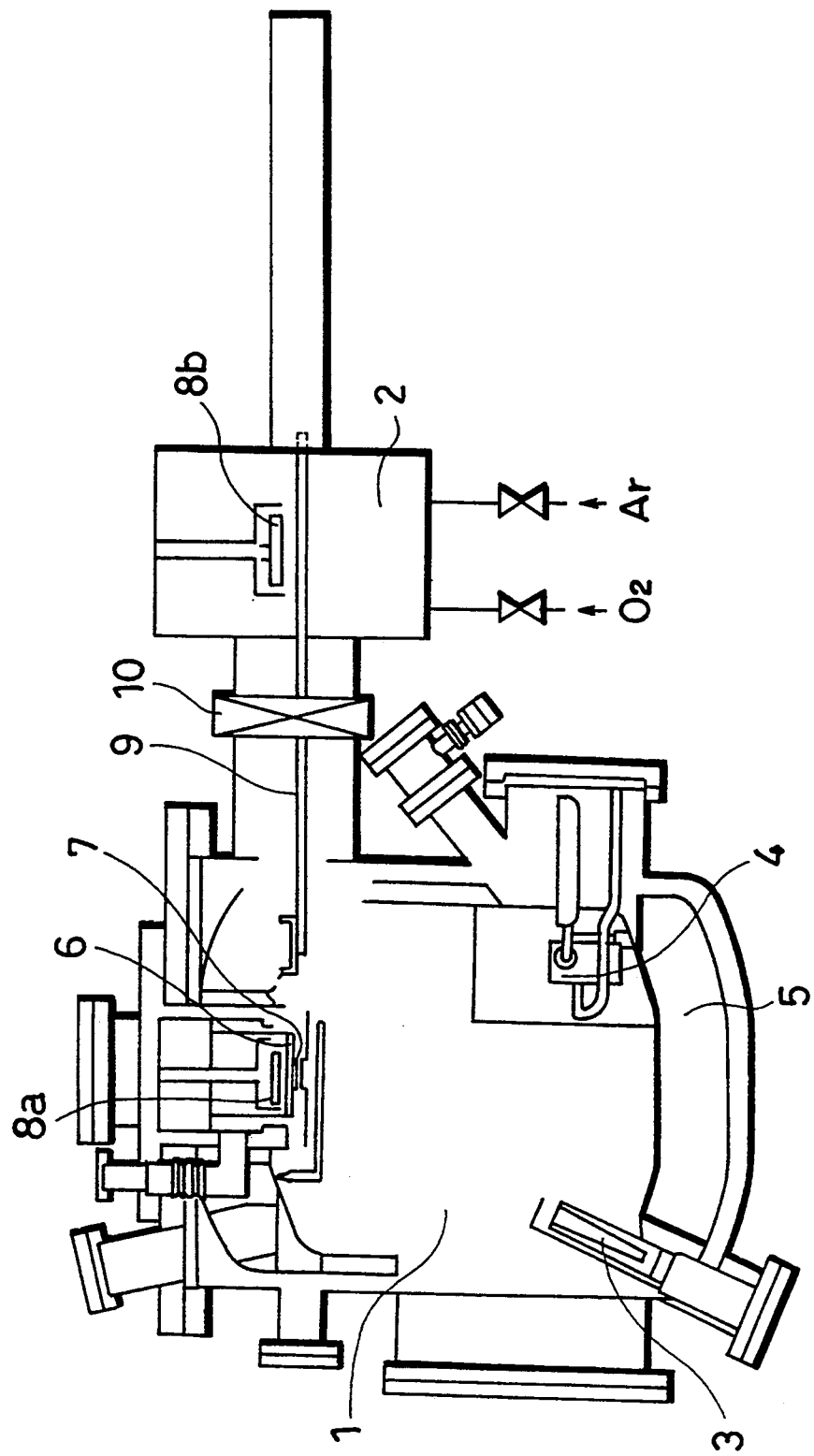
FIG. 1 is a schematic explanatory view illustrating an example of a device for practicing the present invention.

1 ... film-forming chamber
2 ... specimen exchanging chamber
3 ... Knudsen cell
4 ... electron impinging type evaporation source
6 ... substrate holder
7 ... substrate

BEST MODE FOR PRACTICING THE INVENTION

The method (2) described above has a feature capable of forming a homogeneous superconductor thin film on a substrate of a relatively large area. Then, the present inventors have made a study from various approaches with an idea of improving the above-mentioned method having the above-mentioned advantage and overcoming the drawback by using $BaF_2$ as a Ba source. As a result, the present invention has been completed based on the finding that the drawback in the prior art (2) above can be overcome by vapor depositing starting metallic materials such as R, Cu and Ba in the state of metal on a substrate under high vacuum, thereby forming a metallic film and then oxidizing the same and crystallizing the superconducting material by a subsequent heat treatment.

In the present invention, each of the elements of R, Ba and Cu is vapor deposited in the state of metal on the substrate to form a metallic film as a precursor for an oxide superconductor film, in which the vacuum atmosphere is, preferably, such a high vacuum degree as lower pressure than $10^{-8}$ Torr, more preferably, a ultra high vacuum degree as lower pressure than $5\times10^{-10}$ Torr. In the present invention, it is necessary that the metallic film is not taken out into atmospheric air in the course from the formation till the subsequent heat treatment. Since the surface of the metallic film just after it is formed on the substrate is highly active, if the metallic film is taken out into the atmospheric air, the surface of the metallic film is contaminated by reaction with moisture or carbon dioxide in the atmospheric air and it is no more possible to manufacture a satisfactory oxide superconductor film even by the subsequent heat treatment.

According to the present invention, since it is based on the constitution of applying the heat treatment after forming the metallic film, it suffers from less restriction in view of the constitution of the device and the metallic film can be formed over a greater region homogeneously. Further, since the high vacuum is adopted for evaporating the starting material in the state of metal, intrusion of impurities in the atmosphere can be avoided and the film-forming rate and the film composition can be controlled at a high accuracy, thereby enabling to manufacture an oxide superconductor film at a higher quality. Further, according to the present invention, compared with a method of using $BaF_2$ as one of evaporation sources, a step of removing the F-content using steams after film-formation can be saved, and an oxide superconductor film at a high quality can be formed without evolving a toxic HF gas of highly corrosive nature, safely and more economically.

As a device for practicing the method of the present invention, a molecular beam epitaxy (MBE) device, for example, as shown in FIG. 1 can be used. The MBE device has a film-forming chamber 1 and a specimen exchanging chamber 2. In the film-forming chamber 1, are provided a Knudsen cell 3, an electron impinging type evaporation source 4 and the like as an evaporation source for evaporating starting materials for the thin film. The Knudsen cell 3 has a feature capable of accurately controlling the film-forming rate of the starting material. Further, high melting starting material that can not be evaporated by the Knudsen cell 3 can be evaporated by the electron impinging type evaporation source 4. The periphery of the film-forming chamber 1 is surrounded with a cooler 5 referred to as a shroud and using a coolant such as liquid nitrogen, by which a residual gas in the film-forming chamber 1 is adsorbed to keep the inside of the film-forming chamber at a ultra high vacuum degree as lower pressure than $5\times10^{-10}$ Torr. Under such ultra high vacuum, a metallic film with extremely less impurity can be manufactured. In the upper portion within the film-forming chamber 1, substrates 7 are arranged being secured to a substrate holder 6, and the substrates 7 can be heated to a temperature of about 900° C. by substrate heaters 8a, 8b to about 900° C. 8b denotes a heater for heating the substrate disposed in the specimen exchanging chamber 2. The substrate holder 6 can rotate around the center of the substrate holder as an axis thereby enabling to manufacture a homogeneous metallic film over a wide region. When the film is formed, the pressure in the film-forming chamber 1 is reduced to ultra high vacuum, starting evaporation material is evaporated from the Knudsen cell 3 and the evaporation source 4 to the substrate 7 and the material is deposited to the surface of the substrate 7 as a film. The substrate 7 formed with the film is transported by a transfer rod 9 to the specimen exchanging chamber 2. After the completion of the transportation, a gate valve 10 is closed to isolate the specimen exchanging chamber 2 from the film-forming chamber 1. Accordingly, $O_2$ or Ar gas can be supplied to the specimen exchanging chamber 2 to maintain the inside at a predetermined pressure while keeping the inside of the film-forming chamber 1 to ultra high vacuum and preventing the starting evaporation material from oxidation.

Description will now be made to the present invention referring to examples.

EXAMPLE

Figure 2:
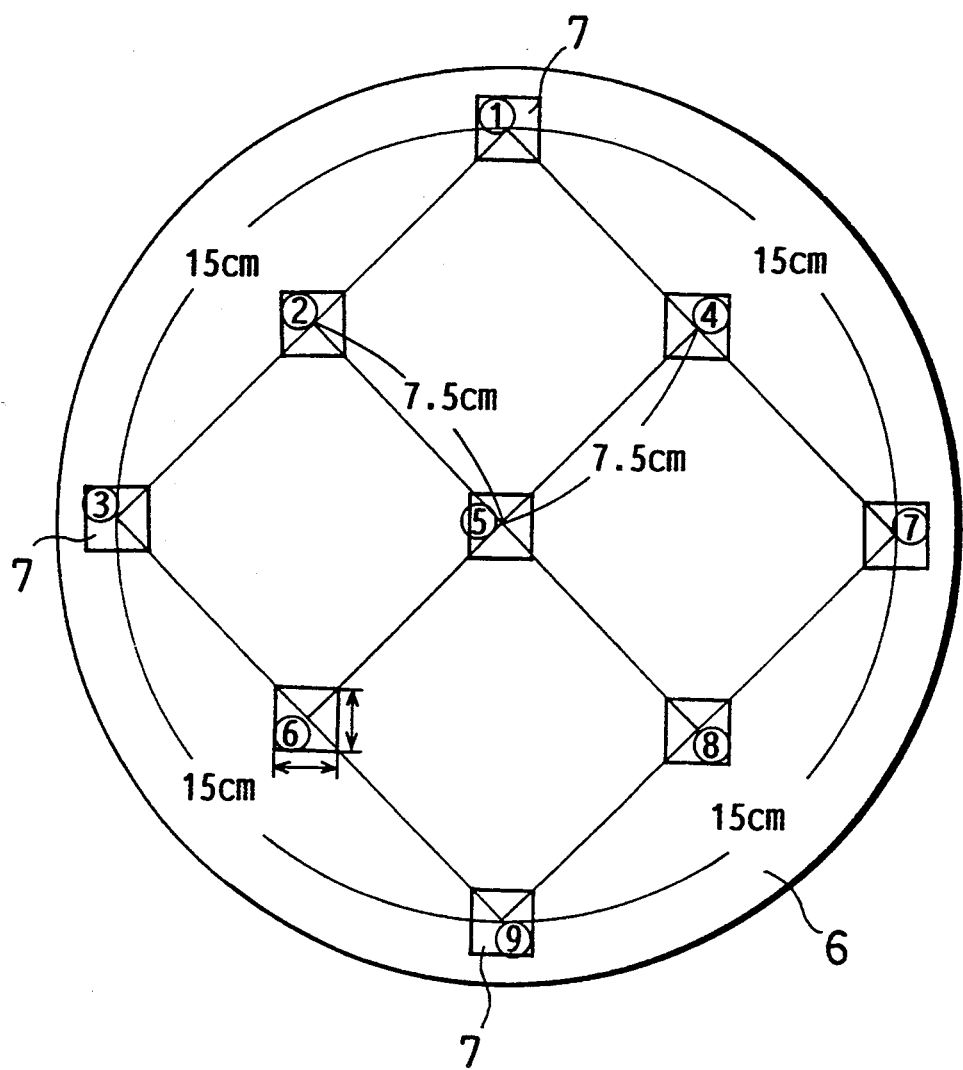
FIG. 2 is a plan view illustrating the state of arranging substrates in this example.

Using the MBE device shown in FIG. 1, film-formation was conducted under the conditions shown in Table 1. A cryogenic pump was used as a main pump to reduce the pressure in the film-forming chamber 1 before the film-formation to super high vacuum of $5\times10^{-10}$ Torr. Further, the pressure in the specimen exchanging chamber 2 was evacuated to $5\times10^{-8}$ Torr by using a turbo molecular pump. Then, Y, Ba and Cu were simultaneously vapor deposited on the substrate. Films were formed by using the electron impinging type evaporation source 4 for Y and the Knudsen cell 3 for Ba and Cu, respectively. FIG. 2 shows the substrate holder 6 and the substrates 7 secured thereto. For examining the distribution of the superconducting characteristics in each of the film-formation regions, identical nine substrates each of $1\times1$ (cm$^2$) size were arranged in a $15\times15$ (cm$^2$) region of the substrate holder. Numericals ①-⑨ shown in FIG. 2 are specimen numbers.

TABLE 1

| | |
|---|---|
| Starting deposition material | Metal of Y, Ba, Cu |
| Substrate | SrTiO$_3$ (100), polished single crystal polished substrate |
| Substrate rotation speed | 10 rpm |
| Substrate temperature during film-formation | 150° C. |
| Film-forming rate | 1 Å/sec for three elements |
| Film thickness | 400 Å |

Figure 3:
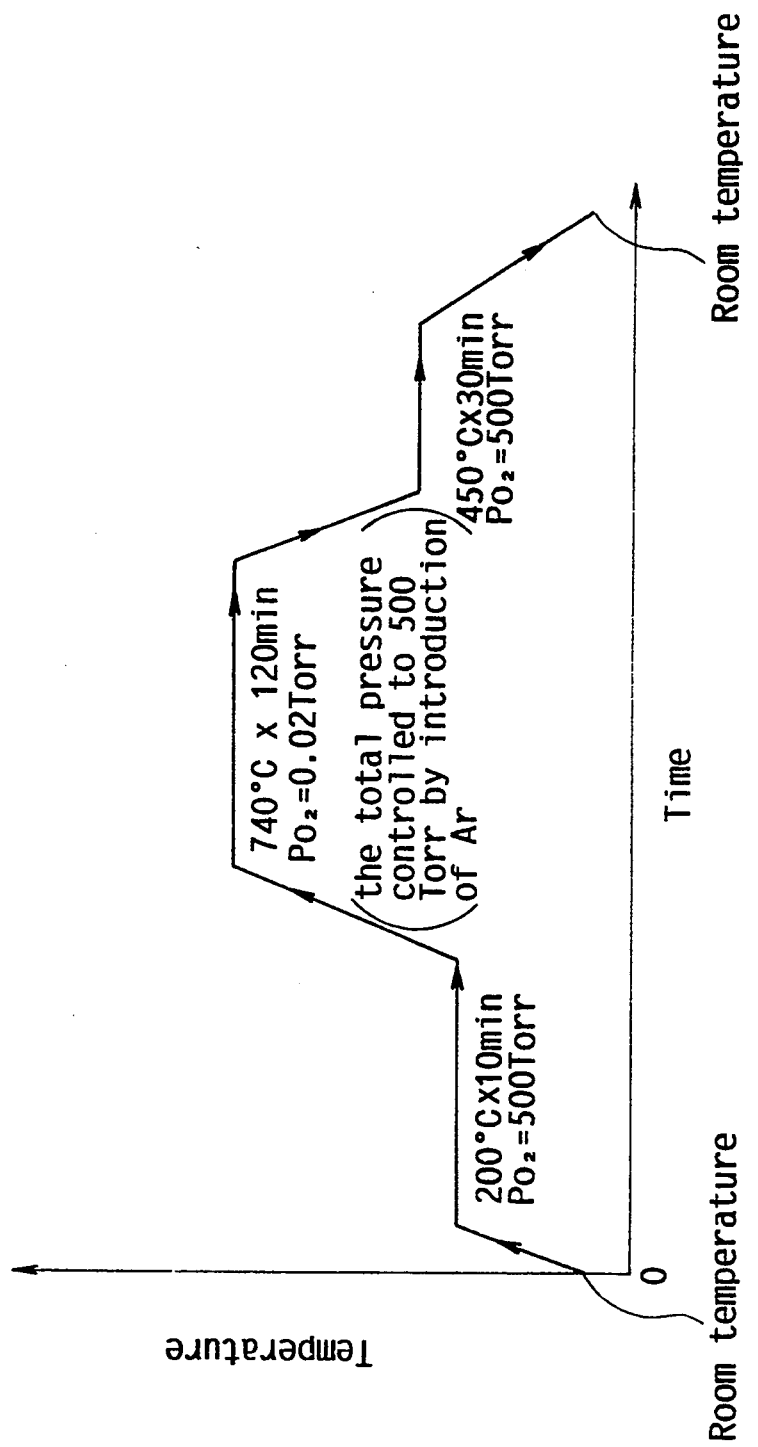
FIG. 3 is a graph illustrating a heat pattern of the heat treatment in the example.

After the film-formation, the gate valve 10 was opened, the specimen was transferred to the specimen exchanging chamber 2 and a heat treatment was applied under the conditions shown in FIG. 3. At first, an oxygen gas was introduced to control the pressure to 500 Torr and, after elevating the substrate temperature to 200° C., it was maintained for about 10 min. At this instance, the specimen was converted into an oxide. Subsequently, after evacuating once and then introducing an oxygen gas to 0.02 Torr, an Ar gas was introduced to elevate the total pressure to 500 Torr, the substrate temperature was elevated to 740° C. and maintained for 120 min. At this instance, the film was crystallized into a tetragonal system. Further, after evacuating and then introducing an oxygen gas to 500 Torr, the temperature was lowered to 450° C. and maintained for 30 min. At this instance, the oxide was crystallized into an orthorhombic crystals. Finally, it was cooled to a room temperature and the specimen was taken out. Table 2 shows the characteristics of the resultant films. The film composition was determined by using an inductively coupled plasma method.

TABLE 2

| Specimen No. | Film composition (ratio for the number of atoms: Y, Ba, Cu) | Tc$_{end}$ (K) | at 77K, OT Jc (A/cm$^2$) |
|---|---|---|---|
| ① | 1:2.00:3.02 | 89.8 | 1.2 × 10$^6$ |

TABLE 2-continued

| Specimen No. | Film composition (ratio for the number of atoms: Y, Ba, Cu) | $Tc_{end}$ (K) | at 77K, OT Jc (A/cm$^2$) |
|---|---|---|---|
| ② | 1:1.98:3.01 | 90.5 | $1.3 \times 10^6$ |
| ③ | 1:1.99:3.00 | 90.3 | $1.2 \times 10^6$ |
| ④ | 1:2.01:3.01 | 89.8 | $1.2 \times 10^6$ |
| ⑤ | 1:2.00:2.99 | 91.0 | $1.5 \times 10^6$ |
| ⑥ | 1:2.01:2.98 | 90.1 | $1.3 \times 10^6$ |
| ⑦ | 1:1.98:3.00 | 89.9 | $1.2 \times 10^6$ |
| ⑧ | 1:1.98:3.01 | 90.7 | $1.4 \times 10^6$ |
| ⑨ | 1:2.00:3.01 | 89.5 | $1.3 \times 10^6$ |

As a result of the analysis for the composition, films of high homogeneity were obtained for all of the nine specimens, in which the ratio for the number of atoms of Ba and Cu to Y was 2±0.02 and 3±0.02, respectively. Further, high superconducting transition temperature (temperature Tc at which the electric resistance is reduced to 0), and critical current density Jc were obtained uniformly regarding the superconducting characteristics for all of the nine specimens. From the above, it can be seen that a homogeneous $YBa_2Cu_3O_{7-x}$ superconductor film could be formed over a wide range of $15 \times 15 = 225$ (cm$^2$).

After the film-formation and transportation to the specimen exchanging chamber 2, when the metallic film was taken out from the specimen exchanging chamber 2 without heat treatment, it has been found that the metallic film was discolored and denatured. The disclosed specimens were applied with a heat treatment under the conditions shown in FIG. 3 but no transition to the superconduction state was attained at a temperature higher than 4.2K. From the above, it can be seen that it is essential to apply the heat treatment in the vacuum chamber without taking the metallic film into the atmospheric air, in order to manufacture a good superconductor film.

Then, for examining the effect of the back pressure on the superconducting characteristics of the film, films were formed under the conditions shown in Table 1 by using a turbo molecular pump as the main pump and reducing the pressure before film-formation to low vacuum of $1 \times 10^{-6}$ Torr and subsequently the heat treatment was applied under the conditions, shown in FIG. 3. The characteristics of the resultant films are shown in Table 3.

TABLE 3

| Specimen No. | Film composition (ratio for the number of atoms: Y, Ba, Cu) | $Tc_{end}$ (K) | at 77K, OT Jc (A/cm$^2$) |
|---|---|---|---|
| ① | 1:1.85:3.10 | 78.0 | $7.9 \times 10^4$ |
| ② | 1:1.80:3.15 | 79.2 | $4.2 \times 10^4$ |
| ③ | 1:2.05:3.20 | 78.5 | $8.9 \times 10^4$ |
| ④ | 1:2.10:2.95 | 79.0 | $8.6 \times 10^4$ |
| ⑤ | 1:2.15:2.80 | 80.0 | $9.0 \times 10^4$ |
| ⑥ | 1:2.03:3.16 | 79.6 | $3.5 \times 10^4$ |
| ⑦ | 1:1.97:2.98 | 79.8 | $5.8 \times 10^4$ |
| ⑧ | 1:1.87:3.05 | 79.0 | $2.0 \times 10^4$ |
| ⑨ | 1:2.20:3.13 | 79.4 | $5.9 \times 10^4$ |

From the Table 3, it can be considered as below. The film composition expressed by the ratio for the number of atoms of Ba, Cu relative to Y was 2±0.2 and 3±0.2, respectively, and the difference between the specimens is increased as compared with the results in Table 2. Also regarding the superconducting characteristics, both Tc and Jc showed lower values and the difference was increased between the specimens as compared with the results in Table 2. It is considered that this is attributable to the fact that the film could not be deposited in a purely metallic state since the evacuation pressure before film-formation was high and impurity particles intruded in the film during formation, as well as that the surface of the starting material was degraded by the impurity elements and the evaporation of the starting material was not stabilized, making it impossible for accurate composition control or the like, which hinders sufficient progress for the crystallization of superconduction.

On the other hand, the present inventors have formed films after evacuating to ultra high vacuum of $5 \times 10^{-10}$ Torr and using rare earth elements of Yb, Er and Gd instead of Y under the conditions shown in Table 1 and applied a heat treatment under the conditions in FIG. 3. As a result, it has been confirmed that high characteristics substantially equal with the results in Table 2 were obtained for all of the nine specimens.

Industrial Applicability

As has been described above according to the present invention, the film-forming rate and the film composition can be controlled easily and an oxide superconductor film can be formed safely and economically, over a wide region, homogeneously at a high quality.

We claim:

1. A method of manufacturing an oxide superconductor film, which comprises the steps of:

vapor depositing each of elements of R, in which R represents one or more elements selected from the group consisting of Y and lanthanide series rare earth elements, Ba, and Cu, each in metallic form, onto a substrate by means of a vacuum deposition process while maintaining a high vacuum of lower than $10^{-8}$ Torr, thereby forming a metallic deposited film, and;

heating the metallic deposited film in an oxidizing atmosphere thereby oxidizing and crystallizing the deposited film, and not exposing the deposited film to atmospheric air during the steps of vapor depositing and heating, thereby manufacturing said oxide superconductor film.

2. A manufacturing method as defined in claim 1, wherein oxidation of the metallic deposited film and crystallization of the deposited film into superconducting material are conducted stepwise, by controlling the concentration of an oxidizing gas contained in the oxidizing atmosphere, substrate temperature, and total pressure around the deposited film.

3. A method of manufacturing an oxide superconducting film, comprising the steps of:

depositing Ba, Cu, and at least one element from the group consisting of Y and lanthanide series rare earth elements, onto a substrate thereby forming a metallic first film on the substrate, wherein said step of depositing comprises maintaining a high vacuum of lower than $10^{-8}$ Torr in a region around the substrate and the depositing elements thereby limiting impurities incorporated into the metallic first film;

heating the metallic first film in an oxidizing atmosphere thereby transforming the metallic first film into a second film; and wherein the first film and the second film are protected against exposure to carbon dioxide and moisture, from during the step of depositing, until after the step of heating.

4. A method according to claim 3, wherein the step of heating further comprises:
pressurizing the region around the substrate to approximately 500 Torr of oxygen and maintaining that oxygen pressure while heating the film to 200° C.;
changing the pressure of the region around the substrate to about 0.02 Torr of oxygen with a total pressure of about 500 Torr, the balance of the total pressure comprising an inert gas and heating the substrate to about 740° C. for about 2 hours; then
changing the pressure of the region around the substrate at a pressure of approximately 500 Torr of oxygen, changing the temperature of the substrate to approximately 450° C., and maintaining the temperature of the substrate and the pressure in the region around the substrate at approximately 450° C. and approximately 500 Torr, respectively, for at least a few minutes.

5. A method according to claim 3, wherein the step of depositing comprises depositing the Ba, Cu, and at least one element from the group consisting of Y and lanthanide series rare earth elements so that the deposited elements have a concentration in the second film whose ratio is approximately 1 atom of the member of the group consisting of Y and lanthanide series rare earth elements to 2 atoms of Ba to 3 atoms of Cu.

6. A method according to claim 3, wherein during the step of depositing the pressure around the substrate is maintained at less than $10^{-10}$ Torr.

7. A method according to claim 3, wherein the substrate is heated to about 200° C. in pure oxygen in order to oxidize the first film and the substrate is then heated to about 740° C. in an atmosphere comprising about 0.02 Torr of oxygen in order to crystallize the film and the substrate is then maintained at about 450° C. in pure oxygen in order to oxidize the crystallized film and thereby form a superconducting orthorhombic phase material in the second film.

8. A method according to claim 3, wherein the step of depositing onto a substrate comprises depositing onto a single crystal substrate.

9. A method according to claim 8, wherein said single crystal substrate is $SrTiO_3$.

10. A method according to claim 3, wherein, during the step of depositing, the substrate temperature is maintained at about 150° C.

11. A method according to claim 3, wherein the step of depositing comprises depositing said first film of less than 1000 Å in thickness prior to the step of heating.

12. A method according to claim 3, wherein the step of depositing comprises depositing onto the substrate at a film forming rate of approximately 1 Å per second.

13. A method according to claim 7, wherein the step of depositing comprises depositing onto a single crystal substrate,
wherein an atomic ratio of Y or lanthanide series rare earth elements, Ba, and Cu is approximately 1:2:3 in the second film after completion of the step of depositing and the step of heating, and
the step of heating comprises:
first, heating the substrate to approximately 200° C. in pure oxygen,
second, heating the substrate to approximately 740° C. in a partial pressure of oxygen of about 0.02 Torr of oxygen, and
third, heating the substrate to about 450° C. in pure oxygen.

14. A method according to claim 3, wherein the second film has a critical current density at 77° K. and $>10^6$ amps per sq/cm.

15. A method according to claim 6, wherein the second film has a critical current density at 77° K. of $>2 \times 10^6$ amps per sq/cm.

16. A method according to claim 3, wherein said at least one element is selected from Yb, Er, Gd, and Y.

17. A superconducting film according to claim 3, wherein the first film is maintained in said high vacuum until being exposed to the oxidizing atmosphere during the step of heating.

18. A method of manufacturing an oxide superconducting film, comprising the steps of:
depositing Ba, Cu, and at least one element from the group consisting of Y and lanthanide series rare earth elements, onto a substrate thereby forming a metallic first film on the substrate, wherein said step of depositing comprises maintaining a high vacuum of lower than $10^{-8}$ Torr in a region around the substrate and the depositing elements thereby limiting impurities incorporated into the metallic first film;
heating the metallic first film in an oxidizing atmosphere thereby transforming the metallic first film into a second film;
wherein the first film and the second film are protected against exposure to carbon dioxide and moisture, from during the step of depositing, until after the step of heating; and
wherein the second film has a critical current density at 77° K. of $>10^6$ amps per sq/cm.

* * * * *